United States Patent
Kan et al.

(10) Patent No.: US 7,486,710 B2
(45) Date of Patent: Feb. 3, 2009

(54) SEMICONDUCTOR LASER DEVICE AND METHOD OF MANUFACTURING THE SAME

(75) Inventors: Hirofumi Kan, Hamamatsu (JP); Hirofumi Miyajima, Hamamatsu (JP); Nobuo Watanabe, Tokyo (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 455 days.

(21) Appl. No.: 10/577,958

(22) PCT Filed: Dec. 16, 2004

(86) PCT No.: PCT/JP2004/018842

§ 371 (c)(1),
(2), (4) Date: May 2, 2006

(87) PCT Pub. No.: WO2005/060057

PCT Pub. Date: Jun. 30, 2005

(65) Prior Publication Data

US 2008/0279239 A1    Nov. 13, 2008

(51) Int. Cl.
*H01S 3/04* (2006.01)
(52) U.S. Cl. .............. 372/35; 372/34; 372/36
(58) Field of Classification Search ............ 372/34, 372/35, 36, 43.01
See application file for complete search history.

(56) References Cited

U.S. PATENT DOCUMENTS

| 4,368,776 A | 1/1983 | Negita et al. |
| 6,233,944 B1 | 5/2001 | Yamada et al. |

FOREIGN PATENT DOCUMENTS

| CN | 1305640 | 7/2001 |
| DE | 4315580 | 11/1994 |
| JP | 5-118473 | 5/1993 |
| JP | 11-121816 | 4/1999 |
| JP | 2002-314281 | 10/2002 |
| JP | 2003-152259 | 5/2003 |
| JP | 2003-273441 | 9/2003 |
| WO | WO 99/21234 | 4/1999 |

*Primary Examiner*—Armando Rodriguez
(74) *Attorney, Agent, or Firm*—Drinker Biddle & Reath LLP

(57) ABSTRACT

A semiconductor laser device 1 comprises: a heat sink 20, in turn comprising a main cooler unit 21, formed by joining metal members, a fluid channel 30, formed inside the main cooler unit 21, a cooling region 23 on an outer wall surface 22, and a resin layer 40, being continuously coated onto the outer wall surface 22 and an inner wall surface 33 with the exception of the cooling region 23; and a semiconductor laser element 80, positioned at the cooling region 23 with thermal contact with the outer wall surface 22 being maintained. By continuously coating the outer wall surface 22 and the inner wall surface 33 with the resin layer 40 with the exception of the cooling region 23, prevention of corrosion near portions at which the outer wall surface and the inner wall surface contact each other is realized.

11 Claims, 9 Drawing Sheets

Fig.4

| CLASSIFICATION | MATERIAL | PERFORMANCE EVALUATION ||||||| LOWNESS OF COST |
| --- | --- | --- | --- | --- | --- | --- | --- | --- |
| | | EASE OF FORMING | ADHESION | WATER RESISTANCE | DENSENESS (NON-PRESENCE OF PINHOLES) | ELECTRICAL INSULATING PROPERTY | THERMAL CHARACTERISTICS | |
| POLYMER | EPOXY-BASED | ◎ | ◎ | ◎ | ○ | ◎ | △ | ◎ (INEXPENSIVE) |
| | ACRYLIC-BASED | △ | ○ | △ | ○ | ○ | △ | ○ (RELATIVELY INEXPENSIVE) |
| | SILICONE | × | △ | △ | ○ | ○ | △ | △ (RELATIVELY EXPENSIVE) |
| | URETHANE | × | × | ○ | × | ○ | × | ○ (RELATIVELY INEXPENSIVE) |
| | POLYIMIDE | △ | ○ | ○ | ○ | ◎ | × | × (EXPENSIVE) |
| | FLUORINE-BASED | × | ○ | △ | ○ | ○ | × | × (EXPENSIVE) |
| CERAMIC | | × | | | | | | × (EXPENSIVE) |
| OTHERS | DIAMOND | | — | — | ○ | ○ | ◎ | × (EXPENSIVE) |
| | DLC (Diamond Like Carbon) | △ | — | — | ○ | ○ | ○ | × (EXPENSIVE) |

NOTE ◎······EXCELLENT
○······GOOD
△······POOR
×······EXTREMELY POOR

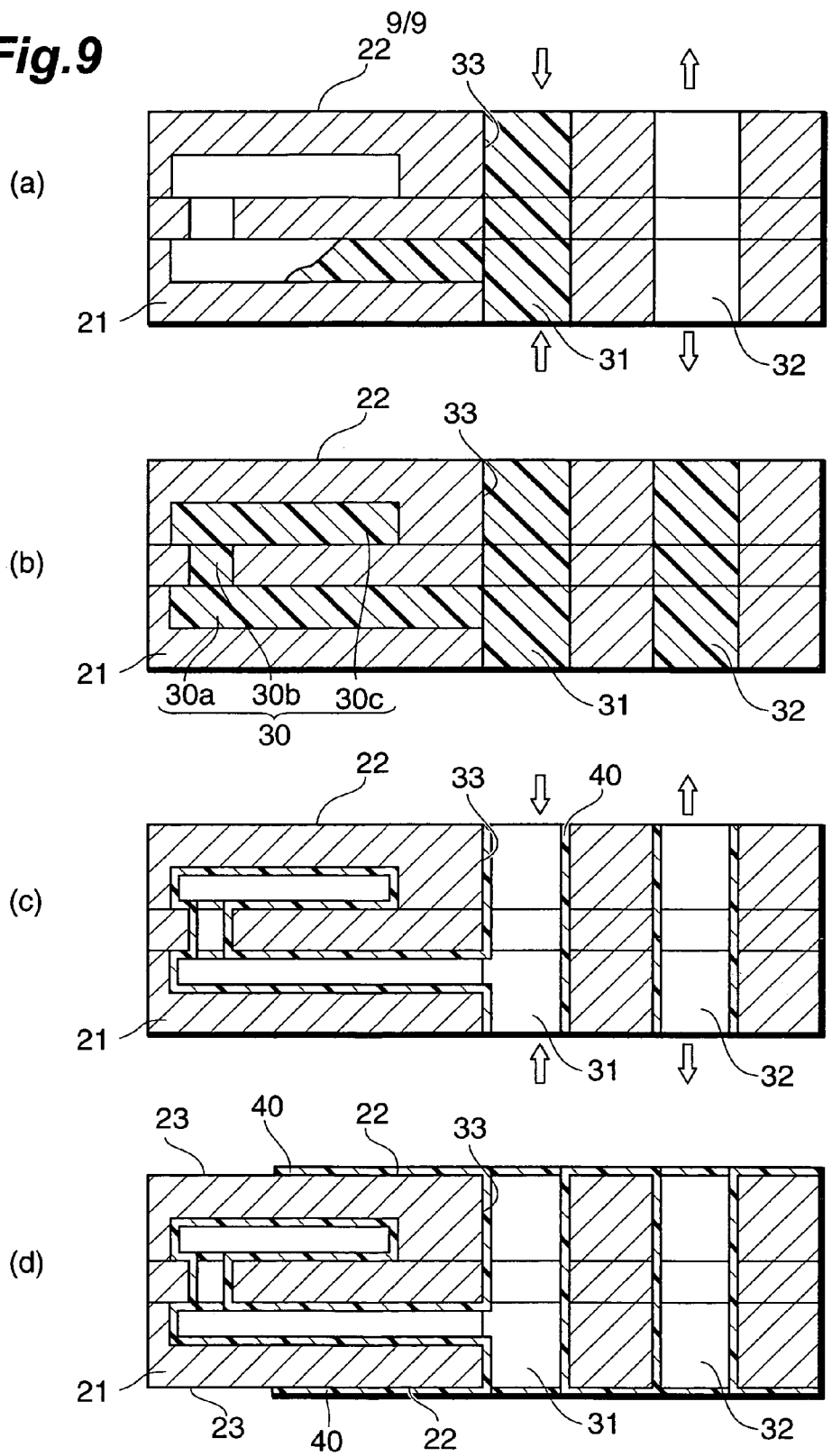

SEMICONDUCTOR LASER DEVICE AND METHOD OF MANUFACTURING THE SAME

TECHNICAL FIELD

This invention concerns a semiconductor laser device that is equipped with a heat sink.

BACKGROUND ART

As a heat sink essential for cooling a heat generating body, such as a high-output semiconductor laser element, a heat sink having a structure, in which a fluid channel is formed by joining copper members or other metal members and in which a fluid for cooling the heat generating body is circulated inside the fluid channel, is known.

To cool semiconductor laser elements, an arrangement, in which semiconductor laser elements are mounted and layered so as to be respectively sandwiched by heat sinks as shown in FIG. 5, is employed. Here, since the respective heat sinks not only cool the respective semiconductor laser elements but also serve as electricity conducting paths among the respective semiconductor laser elements, a potential difference arises between the above-described fluid and the heat sinks.

Thus when long-term circulation of approximately 10,000 hours is performed, volume reduction occurs at the anode side of each heat sink and deposition and attachment of copper corrosion products occur at the cathode side due to electrochemical mechanisms at liquid-contacting portions as shown in FIG. 7.

Such corrosion can be restrained by lowering the conductivity of the fluid. However, as the conductivity is lowered (that is, as the resistance is increased), the activity is increased and the corrosive property thus heightens. Also since a device for lowering the conductivity leads to large size and high cost, the lowering of the conductivity of the fluid is not suitable for preventing corrosion. Also since leak currents flow even if the conductivity is lowered, corrosion effects will occur if circulation is performed over a period of the order of several years (several tens of thousand hours of actual operation).

To prevent such a corrosion, the forming of an isolating layer, which prevents the contacting of the inner wall surfaces of the metal members with the fluid, on the inner wall surfaces without degrading the thermal characteristics has been tried. For example, in a Patent Document 1 described below, a metal, such as Au or an Au alloy, is used as the isolating layer. In a Patent Document 2 described below, an isolating layer formed of resin is used as the isolating layer of a metal tube. The inner wall surface of the obtained metal tube is coated by the resin isolating layer in advance.

Patent Document 1: Japanese Published Unexamined Patent Application No. 2003-273441

Patent Document 2: Japanese Published Unexamined Patent Application No. Hei 5-118473

DISCLOSURE OF THE INVENTION

Objects to be Solved by the Invention

However, with the semiconductor laser device that uses the heat sink employing the above-described metal for the isolating layer, it is difficult to completely eliminate pinholes from the plating of Au, etc., that serves as the isolating layer and when such a pinhole exists, severe corrosion (pitting) occurs from the pinhole.

Also, since the isolating layer is formed only on the inner wall surface of the heat sink and an isolating layer is not formed on the outer wall surface, an isolating layer is not formed near portions at which the outer wall surface and the inner wall surface contact each other and corrosion thus occurs near such portions.

Furthermore, the inner wall surface of the above-described metal tube is coated with the resin layer in advance. Thus when the metal tubes are joined, the portions at which the metal tubes are joined are not coated continuously with the isolating layer and severe corrosion may occur from such portions.

Furthermore, in the case where the isolating layer that covers the heat sink is formed of resin, even when the semiconductor laser element is set on the isolating layer, efficient cooling cannot be performed since the resin isolating layer is low in heat conductivity.

This invention has been made in view of such issues and an object thereof is to provide a semiconductor laser device, equipped with a heat sink that is coated with an isolating layer lessened in pinholes, is enabled to prevent corrosion near portions where an outer wall surface and an inner wall surface contact each other, and can efficiently cool a semiconductor laser element, and a method of manufacturing the semiconductor laser device.

Means for Solving the Problems

In order to achieve the above object, this invention provides a semiconductor laser device, including a heat sink and a semiconductor laser element, the heat sink in turn including a main cooler unit, formed by joining metal members, a fluid channel, formed inside the main cooler unit and having an inlet and an outlet for a fluid, a cooling region, on an outer wall surface of the main cooler unit at which cooling is performed, and a resin layer, being continuously coated onto the outer wall surface and an inner wall surface of the main cooler unit with the exception of the cooling region and preventing the contacting of the metal members and the fluid, and the semiconductor laser element being positioned at the cooling region with thermal contact with the outer wall surface being maintained.

Here, the heat sink is coated with the above-described resin layer. Formation of pinholes can thereby be significantly reduced in comparison to the case of coating with an isolating layer formed of metal.

Also with the heat sink, by continuously coating the outer wall surface and the inner wall surface of the main cooler unit with the resin layer with the exception of the cooling region, corrosion can be prevented from occurring near portions at which the inner wall surface and the outer wall surface contact each other.

Furthermore, the cooling region is not coated. This is done to position the semiconductor laser element while maintaining thermal contact with the outer wall surface. The heat sink can thereby efficiently cool the semiconductor laser element.

The metal members may have through holes and grooves that are portions of the fluid channel and form the fluid channel when the metal members are joined. When such an arrangement is employed, the main cooler unit having the fluid channel formed in its interior can be readily arranged by joining the metal members by bonding.

The semiconductor laser element may be positioned at the cooling region with electrical contact with the outer wall surface being maintained or by being adhered by solder. With this arrangement, when the heat sinks are sandwiched between a plurality of the semiconductor laser elements, the heat sinks can be made to serve as electricity conducting paths among the semiconductor laser elements.

A method of manufacturing the semiconductor laser device according to this invention includes: (1) a member joining step of joining the metal members to form the main cooler unit; (2) a resin layer coating step of continuously coating the resin layer onto the outer wall surface and the inner wall surface of the main cooler unit with the exception of the cooling region; and (3) a laser positioning step of positioning the semiconductor laser element on the cooling region while maintaining thermal contact with the outer wall surface of the main cooler unit.

With this manufacturing method, the metal members are joined together to form the main cooler unit in the first step. In the next step, the resin layer is continuously coated onto the outer wall surface and the inner wall surface of the main cooler unit with the exception of the cooling region. The resin layer, which is the isolating layer, is thereby continuously coated on and the occurrence of corrosion can be prevented by the resin layer.

Furthermore, without coating the resin layer onto the cooling region on the outer wall surface and positioning the semiconductor laser element on the cooling region while maintaining thermal contact, efficient cooling of the semiconductor laser element is realized.

In the above-described resin layer coating step, preferably, the resin is introduced from one end of the fluid channel and drawn out from the other end of the fluid channel to coat the inner wall surface with the resin layer. The resin can thereby be more efficiently coated in comparison to a case where the resin tube is inserted inside the fluid channel and then expanded by heating to coat the inner wall surface.

Also, a semiconductor laser device, including a heat sink and a semiconductor laser element, may be arranged so that the heat sink includes a microchannel heat sink, a fluid channel, a cooling region on an outer wall surface of the microchannel heat sink at which cooling is performed, and a resin layer that prevents the contacting of the microchannel heat sink with the fluid, and the semiconductor laser element is positioned on the cooling region with thermal contact with the outer wall surface being maintained.

Here, the fluid channel is formed inside the microchannel heat sink and has an inlet and an outlet for the fluid. Also, the resin layer is continuously coated onto the inner wall surface of the microchannel heat sink and the outer wall surface with the exception of the cooling region.

EFFECTS OF THE INVENTION

With this invention, a semiconductor laser device, equipped with a heat sink that is coated with an isolating layer lessened in pinholes and boundaries, is enabled to prevent corrosion near portions at which an outer wall surface and an inner wall surface contact each other, and can efficiently cool a semiconductor laser element, and a method of manufacturing this semiconductor laser device can be provided.

BRIEF DESCRIPTION OF THE DRAWINGS

FIG. 4 is a performance evaluation table of materials that may be considered for use in a resin layer;

FIG. 9 shows explanatory diagrams of a resin layer coating step.

EXPLANATION OF REFERENCE NUMERALS

Figure 1:
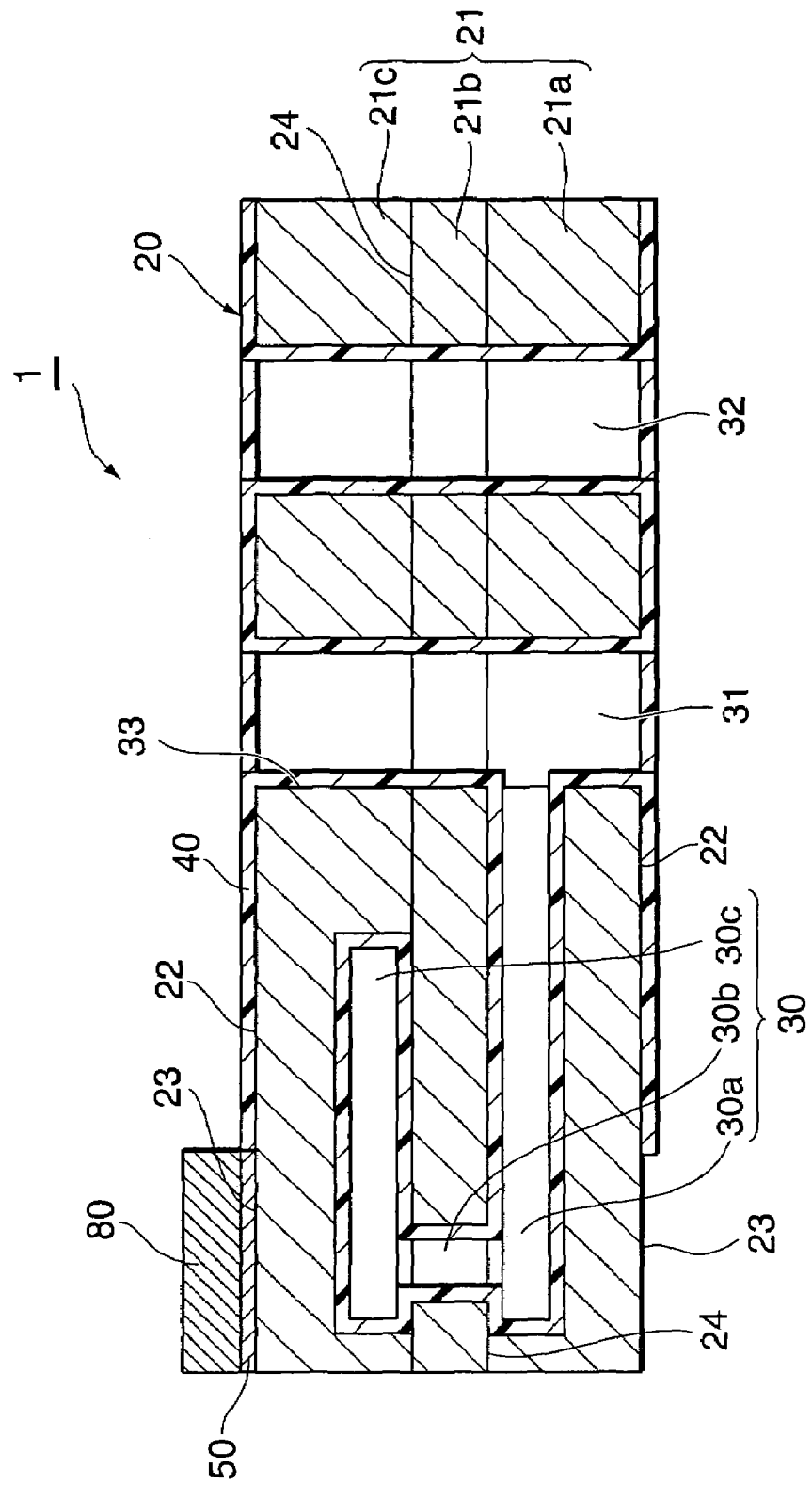
FIG. 1 is a sectional view of a semiconductor laser according to an embodiment.

1 Semiconductor laser device
20 Heat sink
20a Uppermost layer heat sink
20b Lowermost layer heat sink
21 Main cooler unit
21a First metal member
21b Second metal member
21c Third metal member
21d, 21e, 21f, 21g, 21h Metal member
22 Outer wall surface
23 Cooling region
24 Joining interface
24a, 24b, 24c, 24d, 24e, 24f, 24g, 24h, 25a, 25b, 25c, 25d, 25e, 25f,
25g, 25h Through hole
26a, 26c Groove
27a Fixing screw
27b Screw hole
28 Microchannel heat sink
29 Thermal diffusion substrate
30 Fluid channel
30a Inflow channel
30b Communicating channel
30c Outflow channel
31 Inlet
32 Outlet
33 Inner wall surface
34a, 34b, 34c, 35a, 35b, 35c, 36a, 36b, 36c White arrow
40 Resin layer
50 Solder
80 Semiconductor laser element
81 n-side electrode
82 Dummy spacer
83 Silicone rubber
90 Battery
100 Semiconductor laser equipped with microchannel heat sink

BEST MODES FOR CARRYING OUT THE INVENTION

Semiconductor laser devices according to embodiments of this invention shall now be described. For components that are the same, the same symbol shall be used and redundant description shall be omitted. The dimensional proportions in the drawings do not necessarily match those of the description. Also, this invention is not limited to the embodiments.

First, an arrangement of a semiconductor laser device shall be described.

FIG. 1 is a sectional view of a semiconductor laser device 1 according to an embodiment.

The semiconductor laser device 1 includes a semiconductor laser element 80 that emits laser light and a heat sink 20 that cools the semiconductor laser element 80.

The semiconductor laser element 80 is positioned at a cooling region 23 while being kept in thermal contact with an outer wall surface 22. The semiconductor laser element 80 emits laser light when a voltage is applied thereto.

The heat sink 20 includes a main cooler unit 21, a fluid channel 30, formed inside the main cooler unit 21 and having an inlet 31 and an outlet 32 for a fluid, a cooling region 23 on an outer wall surface 22 of the main cooler unit 21 at which cooling is performed, and a resin layer 40 that prevents contacting of metal members with the fluid. The main cooler unit 21 is formed by joining a first metal member 21a, a second metal member 21b, and a third metal member 21c. The resin layer 40 is continuously coated onto an inner wall surface 33 of the main cooler unit 21 and the outer wall surface 22 with the exception of the cooling region 23.

Here as the metal members, those of high heat conductivity are preferable, and those formed of copper or a copper alloy are especially preferable. The fluid channel 30 extends so as to cross joining interfaces 24, which are the surfaces at which the metal members are joined. An inlet 31 and outlet 32 are arranged from an inflow channel 30a, into which the fluid is supplied, an outflow channel 30c, which makes the fluid flow out, and communicating channels 30b, which connect the inflow channel 30a and the outflow channel 30c.

By continuously coating with resin layer 40, corrosion near portions at which the outer wall surface 22 and inner wall surface 33 contact each other, that is, corrosion of the edge portions is prevented. Furthermore, the occurrence of electrical shorting that occurs when a water leakage, etc., occurs at an edge portion is also prevented. In a case where an interposed member (O-ring, etc.) is present at a portion at which the fluid inlet 31 and a supplying portion that supplies the fluid are joined, the resin layer 40 is greater in area than the region in contact with the interposed member.

The semiconductor laser element 80 may be adhered onto the cooling region 23 with electrical contact with the outer wall surface 22 being maintained or by means of a solder 50. In this case, when heat sinks 20 are sandwiched between a plurality of the semiconductor laser elements, the heat sinks 20 can be arranged as electricity conducting paths.

Furthermore, to efficiently cool the semiconductor laser element 80, the semiconductor laser element 80 is positioned at the cooling region 23 with thermal contact with the outer wall surface 22 being maintained.

The arrangement of the main cooler unit 21 shall now be described.

Figure 2:
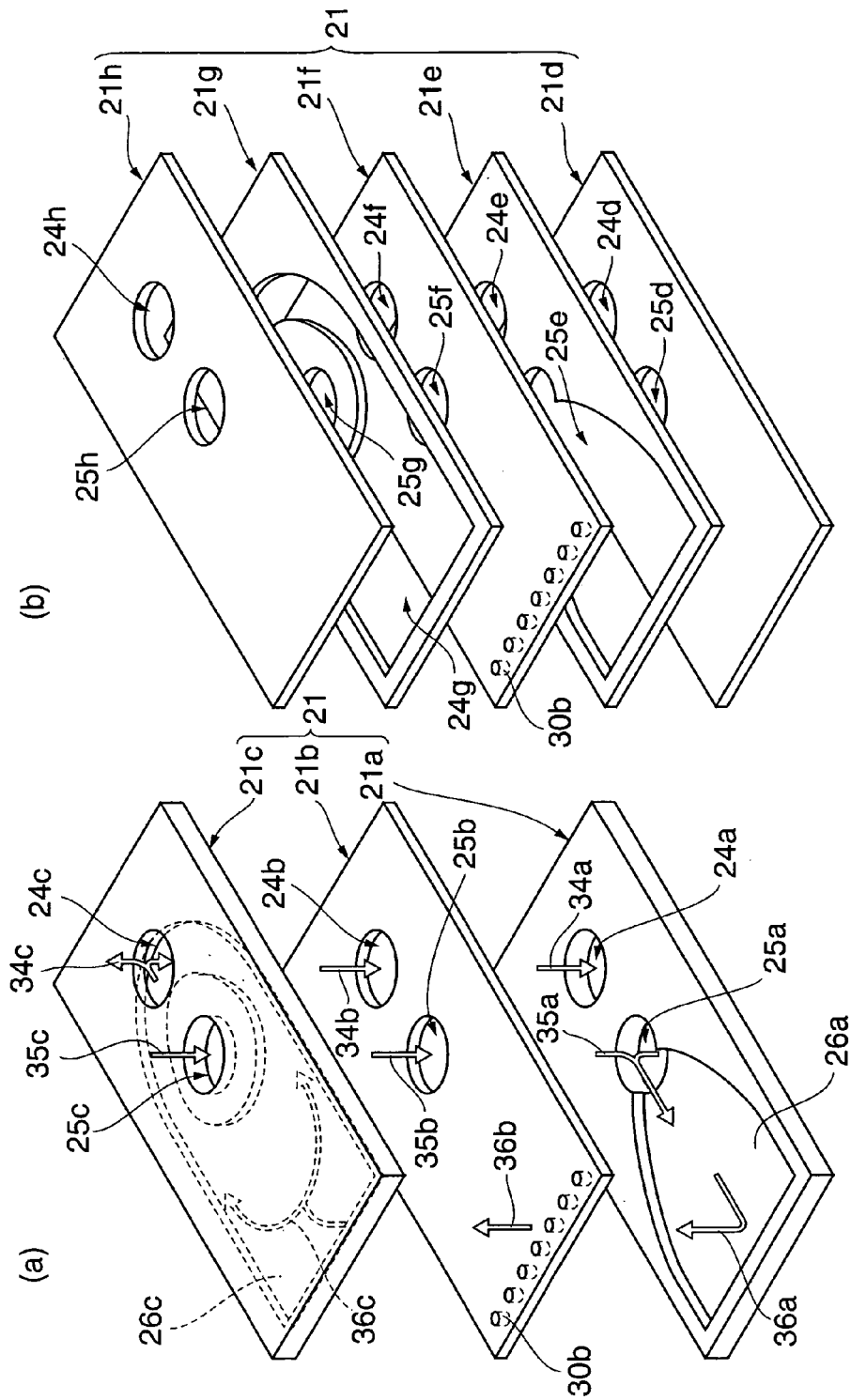
FIG. 2 shows exploded perspective views of main cooler units.

FIG. 2 shows exploded perspective views of the main cooler units 21.

The main cooler unit 21 is formed by joining the first metal member 21a, the second metal member 21b, and the third metal member 21c as shown in FIG. 2-(a). The main cooler unit 21 may instead be formed by joining five metal members 21d, 21e, 21f, 21g, and 21h as shown in FIG. 2-(b).

As shown in FIG. 2-(a) and FIG. 2-(b), the metal members may respectively have through holes and grooves (recesses) that are portions of the fluid channel and form the fluid channel when the metal members are joined. In this case, the main cooler unit 21, having the fluid channel formed in the interior, can be readily arranged by joining the metal members. The joining can be achieved by layering the metal members and bonding together the contacting surfaces by diffusion bonding or by bonding using a solder or a brazing metal.

A description shall now be given in regard to FIG. 2-(a).

The first metal member 21a has two through holes 24a and 25a and a groove 26a. The groove 26a has a depth that is approximately half the thickness of the metal member 21a and a portion thereof is continuous with the through hole 25a. The width of the groove 26a widens in the length direction of the first metal member 21a with the position of the through hole 25a as the starting point.

The third metal member 21c has two through holes 24c and 25c at positions respectively overlapping with through holes 24a and 25a of the first metal member 21a. The third metal member 21c also has a groove 26c with a depth approximately half the thickness of the third metal member 21c and a portion thereof is continuous with the through hole 24c. The groove 26 has a width that widens in an arcuate manner in the length direction of the third metal member 21c with the position of the through hole 24c as the starting point and the width of the groove 26c converges to a fixed value at the communicating channel 30b side of the through hole 25c. Here, a portion of the groove 26c overlaps with the groove 26a of the first metal member 21a.

The second metal member 21b has two through holes 24b and 25b at positions respectively overlapping with the through holes 24a and 25a of the first metal member 21a. Also, the plurality of communicating channels 30b are formed at the portion at which groove 26a of the first metal member 21a overlaps with the groove 26c of the third metal member 21c.

By bonding an upper surface of the first metal member 21a to a lower surface of the second metal member 21b and bonding an upper surface of the second metal member 21b to a lower surface of the third metal member 21c, an inflow channel 30a (see FIG. 1), into which the fluid is supplied, is formed by the groove 26a of the first metal member 21a and the lower surface of the second metal member 21b. Likewise, an outflow channel 30c (see FIG. 1) that makes the fluid flow out is formed by the groove 26c of the third metal member 21c and the upper surface of the second metal member 21b.

The through hole 25a of the first metal member 21a, the through hole 25b of the second metal member 21b, and the through hole 25c of the third metal member 21c are connected to form the inlet 31 (see FIG. 1) for supplying the fluid into the inflow channel 30a. The through hole 24a of the first metal member 21a, the through hole 24b of the second metal member 21b, and the through hole 24c of the third metal member 21c are connected to form the outlet 32 (see FIG. 1) for making the fluid flow out from the outflow channel 30c (see FIG. 1).

As described above, the fluid channel 30 (see FIG. 1) is arranged from the inflow channel 30a, the communicating channel 30b (see FIG. 1), and the outflow channel 30c. The fluid channel 30 has the inlet 31 and the outlet 32.

The flow of the fluid shall now be described.

The fluid that flows in from the through hole 25a or the through hole 25c flows in the direction of the white arrows and flows out from the through hole 24a or the through hole 24c. That is, the fluid that enters the inlet 31 flows into the communicating channel 30b via the inflow channel 30a. This fluid then flows into the outlet 32 via the outflow channel 30c. The fluid furthermore flows out upon branching upward or downward in the FIGURE near the through hole 24c. Lastly, the fluid flows out from the through hole 24a or the through hole 24c.

With the heat sink shown in FIG. 2-(b), the metal member 21e has an opening 25e and a through hole 24e, the metal member 21d has two through holes 25d and 24d, and a member formed by joining these members has the same shape as the first metal member 21a. The metal member 21f has through holes 25f and 24f and has the same shape as the second metal member 21b. The metal member 21g has an opening 24g and has a plate, having a through hole 25g, disposed inside the opening 24g, the metal member 21h has two through holes 25h and 24h, and a member formed by joining these members has the same shape as the third metal member 21c. These joined heat sinks have the same functions.

The resin layer that is coated onto the heat sink shall now be described.

Figure 3:
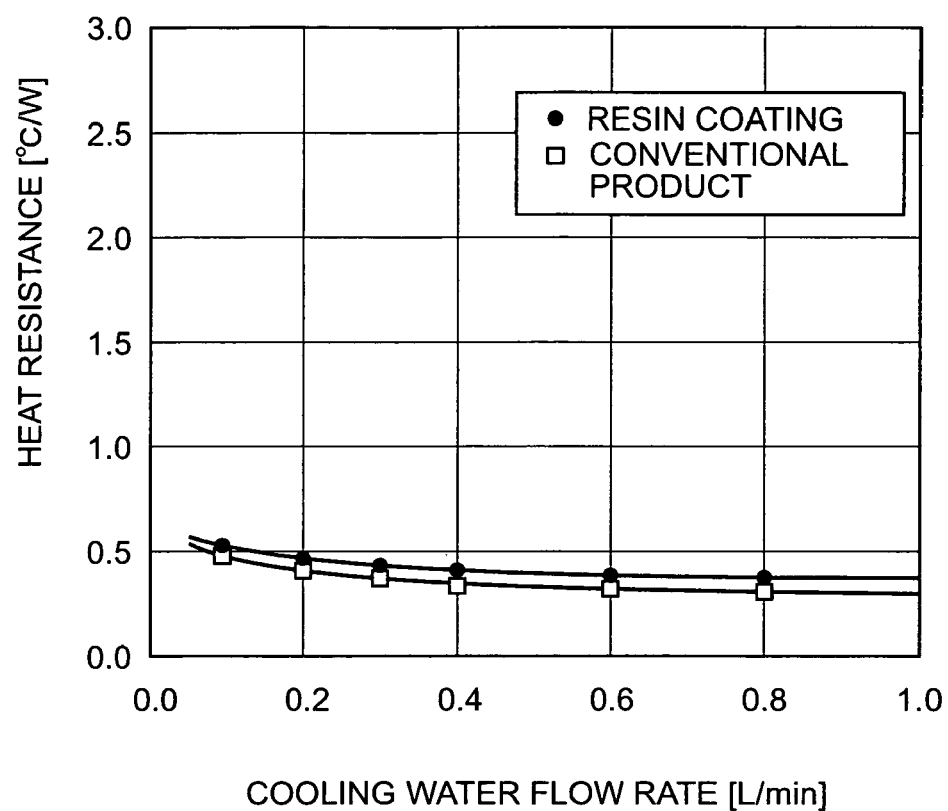
FIG. 3 is a graph depicting a variation of heat resistance with a variation of a cooling water flow rate for different isolating layers.

FIG. 3 is a graph depicting a variation of heat resistance with a variation of a cooling water flow rate for a case where an isolating layer formed of resin is used and for a case where the above-described product (conventional product) of Patent Document 1 is used.

As the isolating layer that is coated onto the heat sink, a layer formed of resin is employed. Pinholes can be thereby significantly lessened in comparison to cases where a metal isolating layer is used. Also, the heat resistance in the case where an isolating layer formed of resin is used does not differ much from the case where the conventional product is used as the isolating layer as shown in FIG. 3, and inadvertent effects of using a resin isolating layer are extremely small.

The material used in the resin layer shall now be described.

FIG. 4 is a performance evaluation table of materials that may be considered for use in a resin layer.

As the material used in the resin layer, an epoxy resin is preferable based on the evaluation of ease of forming, adhesion, water resistance, denseness (non-presence of pinholes), insulating property, and lowness of cost. The film thickness of the resin layer is preferably 7 μm to 30 μm. This is because with a film thickness less than 7 μm, the probability of formation of pinholes cannot be lowered and with a film thickness greater than 30 μm, the heat resistance increases and peeling due to film stress occurs. Though besides epoxy-based resins, acrylic-based resins, silicone resins, urethane resins, polyimide resins, and fluorine-based resins may be cited as resin materials, among these, epoxy-based resins have excellent characteristics.

A device, in which a plurality of the semiconductor laser devices according to this invention are layered, shall now be described.

Figure 5:
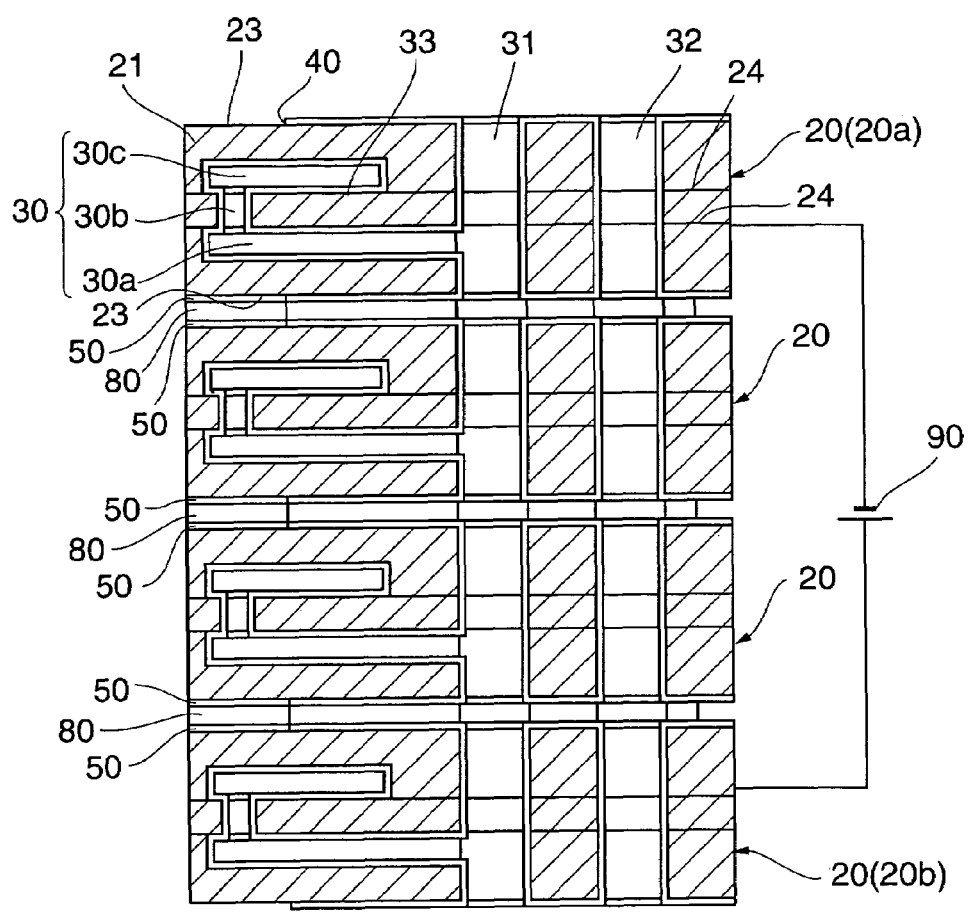
FIG. 5 is a diagram of an arrangement formed by layering the semiconductor laser devices.

FIG. 5 is a diagram of an arrangement formed by layering the semiconductor laser devices 1.

An arrangement in which a plurality of semiconductor laser devices 1 are layered is thus possible. For example, as shown in FIG. 5, three semiconductor laser elements 80 are mounted and layered so as to be sandwiched by four heat sinks 20, 20, 20a, and 20b. A negative electrode of a battery 90 is connected to the heat sink 20a of the uppermost layer, and a positive electrode of the battery 90 is connected to the heat sink 20b of the lowermost layer.

Here, when each semiconductor laser element 80 is positioned at the cooling region 23 with electrical contact with the outer wall surface being maintained by the solder 50, heat sinks 20, 20, 20a, and 20b not only cool the semiconductor laser elements 80 but also serve as electricity conducting paths among the semiconductor laser elements 80. A potential difference thus arises between the fluid and the heat sinks.

A semiconductor laser device of another embodiment shall now be described.

Figure 6:
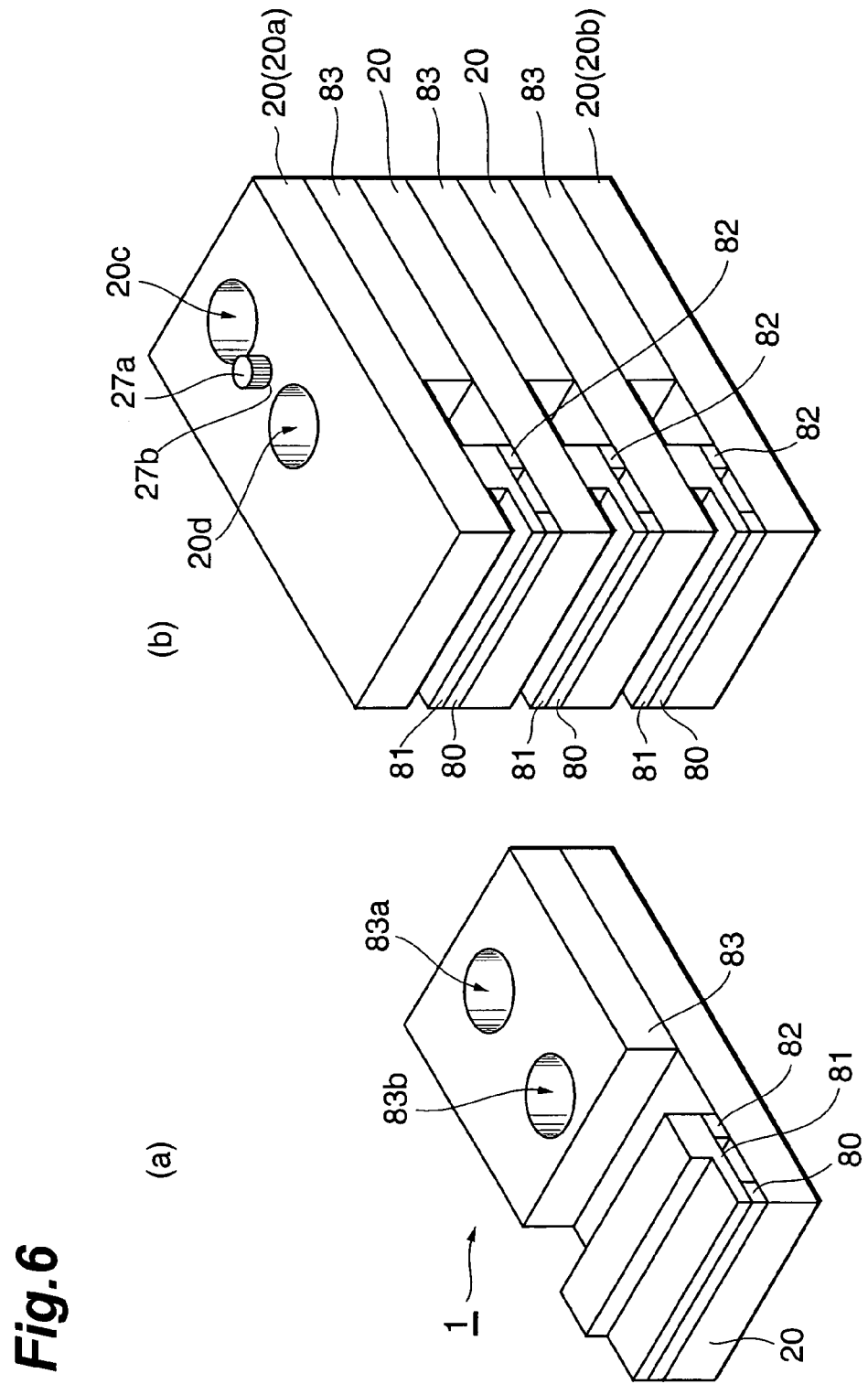
FIG. 6 shows perspective views of a single-layer semiconductor laser device and a multiple-layer semiconductor laser device.

FIG. 6 shows perspective views of a single-layer semiconductor laser device and a multiple-layer semiconductor laser device.

FIG. 6-(a) is a perspective view of a single semiconductor laser device 1. In addition to the semiconductor laser element 80 and heat sink 20, the semiconductor laser device 1 has an n-side electrode 81 disposed on the top of the semiconductor laser element 80, a dummy spacer 82 that fills the interval between the n-side electrode 81 and heat sink 20, and a sealing silicone rubber 83 disposed on the top of the heat sink 20. An O-ring may be used in place of the sealing silicone rubber 83.

FIG. 6-(b) is a perspective view of an arrangement in which a plurality of the above-described single semiconductor laser devices 1 are layered. The heat sink 20a of the uppermost layer in FIG. 6-(b) may be connected to a negative electrode of a battery, and the heat sink 20b of the lowermost layer may be connected to a positive electrode of the battery. By thus connecting to the battery, semiconductor laser elements 80 can be made to emit laser light. Here, a fixing screw 27a and a screw hole 27b for the screw are preferably provided to layer and fix the plurality of the semiconductor laser devices.

A copper corrosion mechanism shall now be described along with as to where the arrangement of this invention should at least be applied.

Figure 7:
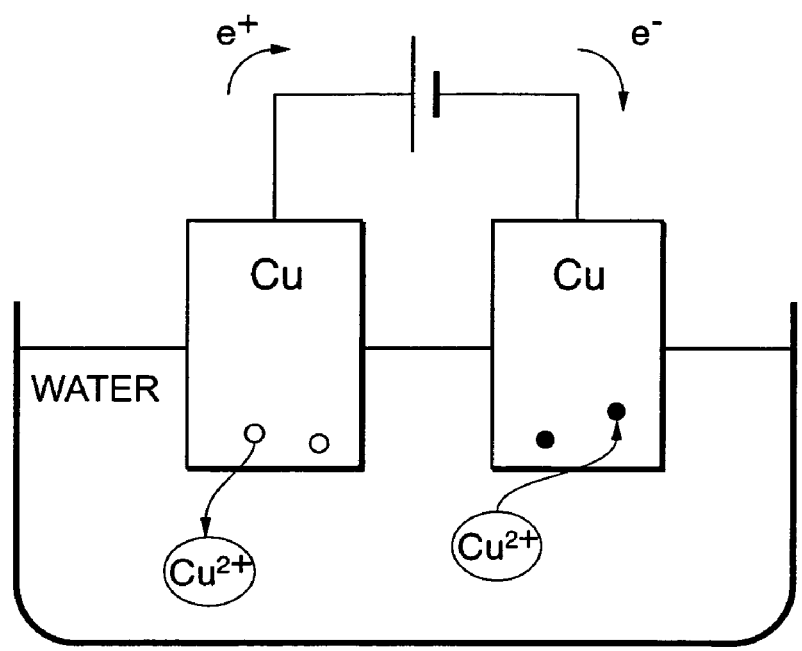
FIG. 7 is an explanatory diagram of a copper corrosion mechanism.

FIG. 7 is an explanatory diagram of a copper corrosion mechanism.

With the conventional device, corrosion occurs due to a copper corrosion mechanism caused by the above-described potential difference. That is, volume reduction of copper occurs at the anode (positive electrode) side of the heat sink and deposition and attachment of copper corrosion products occur at the cathode (negative electrode) side. Copper corrosion occurs, for example, at the heat sinks 20a and 20b (see FIG. 5) of the uppermost layer and the lowermost layer of a layered device. The above-described reaction between the fluid and the metal members is considered to be the cause of this corrosion. In this case, the arrangement of this invention is applied at least to the heat sinks 20a and 20b (see FIG. 5) of the uppermost layer and the lowermost layer.

A semiconductor laser device that includes a heat sink and a semiconductor laser element and wherein the heat sink includes a microchannel heat sink, a fluid channel, a cooling region on an outer wall surface of the microchannel heat sink at which cooling is performed, and a resin layer that prevents the contacting of the microchannel heat sink with the fluid, and wherein the semiconductor laser element is positioned at the cooling region with thermal contact with the outer wall surface being maintained, shall now be described.

Here, the fluid channel is formed inside the microchannel heat sink and has an inlet and an outlet for the fluid. Also, the resin layer is continuously coated onto the inner wall surface of the microchannel heat sink and the outer wall surface with the exception of the cooling region.

Figure 8:
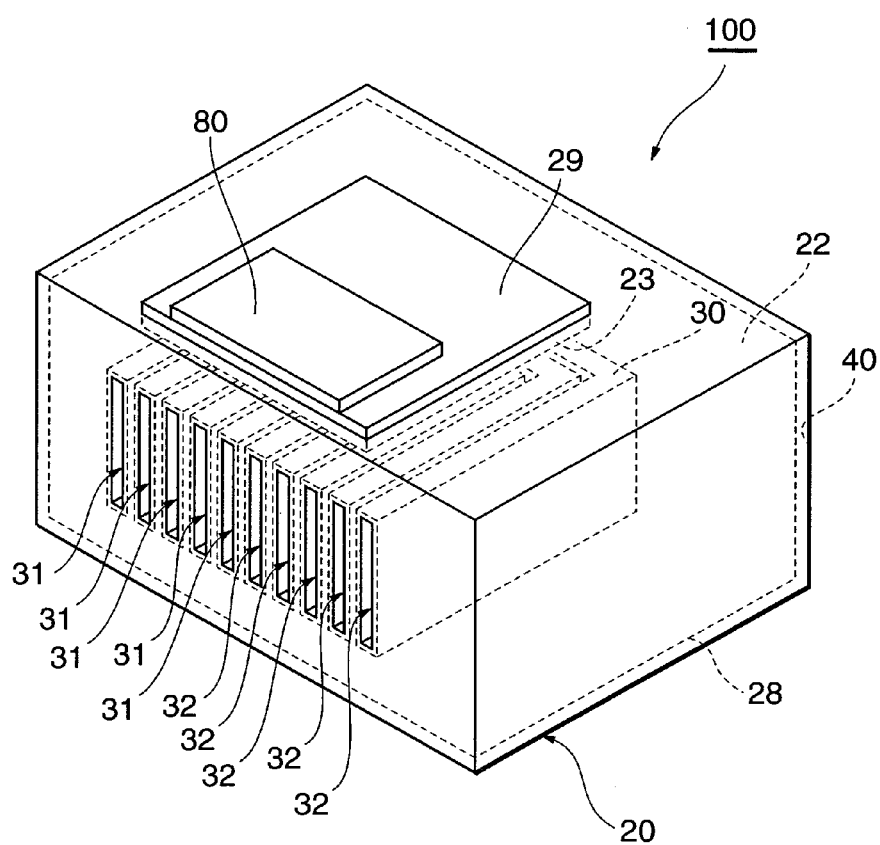
FIG. 8 is a perspective view of a semiconductor laser device equipped with a microchannel heat sink.

FIG. 8 is a perspective view of a semiconductor laser device 100 equipped with a microchannel heat sink 28.

The heat sink 20 may have an arrangement including the microchannel heat sink 28, the fluid channel 30, formed inside the microchannel heat sink 28, the cooling region 23 on the outer wall surface 22 of the microchannel heat sink 28 at which cooling is performed, and the resin layer 40. Semiconductor laser element 80 can be thereby efficiently cooled. The semiconductor laser device 100, having the microchannel heat sink 28, may also have an arrangement in which the semiconductor laser element 80 is positioned on the cooling region 23 across a thermal diffusion substrate 29.

A method of manufacturing the semiconductor laser device 1 shall now be described. The semiconductor laser device 1 can be manufactured by successively carrying out the following steps (1) to (3).

Step (1) Member Joining Step

First, as shown in FIG. 2-(a), the first metal member 21a, the second metal member 21b, and the third metal member 21c are joined to form the main cooler unit 21. The joining can be achieved by layering the metal members and bonding together the contacting surfaces by diffusion bonding or by bonding using a solder or a brazing metal. Since this step is carried out under a high-temperature environment, if the resin layer has been coated on, the resin layer will melt. The inner wall surface is thus not coated with the resin layer prior to joining. By the above joining, the fluid channel, having the inlet 31 (see FIG. 1) and the outlet 32 (see FIG. 1) are formed inside the main cooler unit 21.

Step (2) Resin Layer Coating Step

FIG. 9 shows explanatory diagrams of a resin layer coating step.

The resin layer 40 is then continuously coated onto the outer wall surface 22 and the inner wall surface 33 of the main cooler unit 21 with the exception of the cooling region 23. The resin layer 40, which is the isolating layer, is thus continuously coated and the occurrence of corrosion at the resin layer 40 can be prevented.

First, as shown in FIG. 9-(a), the resin, which prevents contact of the metal members with the fluid, is cast in from the inlet 31 and made to flow out from the outlet 32 in the directions of the white arrows shown in the FIGURE. In casting the resin, leakage of the resin may be prevented by positioning, on outer wall surface 22, an O-ring, etc., that surrounds a portion where the portion to which resin is supplied and the inlet 31 are connected. The directions in which the resin is cast may be the opposite of the directions of the white arrows. This casting step is performed until the interior of the fluid channel 30 is filled with the resin as shown in FIG. 9-(b).

Here, the resin includes a base resin, a curing agent, and a solvent. Epoxy resin can be cited as an example of the base resin of the resin. Polyimide-amide, phenol, or urea can be cited as the curing agent of the resin.

The above casting step may be a step in which the resin is introduced from the inlet 31, which is one end of the fluid channel 30, and drawn out by suction from the outlet 32, which is the other end. The inner wall surface can be thereby efficiently coated by the resin layer.

Then as shown in FIG. 9-(c), nitrogen gas is blown in from the inlet 31 and discharged from the outlet 32 in the directions of the white arrows shown in the FIGURE. The directions in which the nitrogen gas is blow in may be the opposite of those shown. Thereafter, curing is performed by heat treatment at 100° C. for 1 hour and at 150° C. for 30 minutes. The series of steps from the casting of FIG. 9-(a) to the curing by heat treatment is repeatedly performed a plurality of times.

The resin is furthermore coated onto the outer wall surface 22 of the main cooler unit 21 with the exception of the cooling region 23 as shown in FIG. 9-(d). In coating with the resin, leakage of resin may be prevented by positioning, on the outer wall surface 22, an O-ring, etc., that surrounds a portion where the portion to which resin is supplied and the portion to be coated are connected. Thereafter, curing is performed by heat treatment at T1 (80° C. to 120° C.; preferably 100° C.) for 1 hour and at T2 (130° C. to 170° C.; preferably 150° C.) for 30 minutes. Here, an epoxy-based resin is used. Thus the resin layer 40 can be continuously coated onto the outer wall surface 22 and the inner wall surface 33 with the exception of the cooling region 23.

Though the coating was carried out in the two steps of the inner wall surface coating step and the outer wall surface coating step here, the coating may be carried out instead in a single step of coating by casting by making the amount of resin cast in the step of FIG. 9-(a) an amount by which the outer wall surface and the inner wall surface can be coated.

Step (3) Laser Positioning Step

The semiconductor laser element 80 is then positioned at the cooling region 23 in a state in which thermal contact with the outer wall surface 22 of the main cooler unit 21 is maintained as shown in FIG. 1. This positioning can be carried out in the form of adhesion by the solder 50. When adhesion by the solder 50 is to be carried out, since this is performed after the outer wall surface 22 and the inner wall surface 33 have been coated with the resin layer 40 with the exception of the cooling region 23, the solder 50 must be melted at a temperature lower than the melting temperature of the resin layer 40. Furthermore, the solder 50 must be melted at a temperature lower than the temperature required to join the above-described metal members 21a, 21b, and 21c.

INDUSTRIAL APPLICABILITY

This invention can be used as a semiconductor laser device having a heat sink.

The invention claimed is:

1. A semiconductor laser device comprising:
a heat sink; and
a semiconductor laser element,
wherein
said heat sink has:
   a main cooler unit, formed by joining metal members;
   a fluid channel, formed inside the main cooler unit and having an inlet and an outlet for a fluid;
   a cooling region on an outer wall surface of the main cooler unit at which cooling is performed; and
   a resin layer, being continuously coated onto the outer wall surface and an inner wall surface of the main cooler unit with the exception of the cooling region and preventing the contacting of the metal members and the fluid, and
wherein
said semiconductor laser element is positioned at the cooling region with thermal contact with the outer wall surface being maintained.

2. The semiconductor laser device according to claim 1, wherein the metal members has through holes and grooves, which are continuous with the through holes, as portions of the fluid channel.

3. The semiconductor laser device according to claim 1, wherein the semiconductor laser element is positioned at the cooling region with electrical contact with the outer wall surface being maintained.

4. The semiconductor laser device according to claim 3, wherein the semiconductor laser element is adhered to the cooling region and to the outer wall surface by a solder.

5. The semiconductor laser device according to claim 1, wherein the resin layer is an epoxy-based resin.

6. A method of manufacturing the semiconductor laser device according to claim 1, the semiconductor laser device manufacturing method comprising:
a member joining step of joining the metal members to form the main cooler unit;
a resin layer coating step of continuously coating the resin layer onto the outer wall surface and the inner wall surface with the exception of the cooling region; and a laser positioning step of positioning the semiconductor laser element at the cooling region with thermal contact with the outer wall surface being maintained.

7. The semiconductor laser device manufacturing method according to claim 6, wherein in the resin layer coating step, the resin is introduced from one end and drawn out from the other end of the fluid channel to coat the inner wall surface with the resin layer.

8. The semiconductor laser device manufacturing method according to claim 6, further comprising a step of curing the resin layer.

9. The semiconductor laser device manufacturing method according to claim 8, wherein the resin layer is an epoxy-based resin, and when $T1<T2$, the resin layer is heated at a temperature $T1°$ C. and thereafter heated at a temperature $T2°$ C. in the curing step.

10. A semiconductor laser device comprising:
a heat sink; and
a semiconductor laser element,
wherein
the heat sink has:
a microchannel heat sink;
a fluid channel, formed inside the microchannel heat sink and having an inlet and an outlet for a fluid;
a cooling region on an outer wall surface of the microchannel heat sink at which cooling is performed; and
a resin layer, being continuously coated onto the outer wall surface and an inner wall surface of the microchannel heat sink with the exception of the cooling region and preventing the contacting of the microchannel heat sink with the fluid; and
the semiconductor laser element is positioned on the cooling region with thermal contact with the outer wall surface being maintained.

11. The semiconductor laser device according to claim 8, wherein the resin layer is an epoxy-based resin.

* * * * *